(12) United States Patent
Brennan et al.

(10) Patent No.: US 7,221,233 B2
(45) Date of Patent: May 22, 2007

(54) NONVOLATILE PROGRAMMABLE CRYSTAL OSCILLATOR CIRCUIT

(75) Inventors: Aaron Brennan, Moscow, ID (US); Mark Lugar, Moscow, ID (US); Mike McMenamy, Tensed, ID (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/949,176

(22) Filed: Sep. 24, 2004

(65) Prior Publication Data
US 2006/0071727 A1    Apr. 6, 2006

(51) Int. Cl.
*H03B 5/32* (2006.01)
(52) U.S. Cl. .................. 331/158; 331/116 R
(58) Field of Classification Search ............ 331/158, 331/116 R
See application file for complete search history.

(56) References Cited

U.S. PATENT DOCUMENTS

| | | | |
|---|---|---|---|
| 5,777,383 A * | 7/1998 | Stager et al. ............ 257/700 |
| 6,563,390 B1 | 5/2003 | Kizziar ................ 331/116 R |
| 6,927,641 B2 * | 8/2005 | Terasawa et al. ......... 331/158 |
| 2002/0149435 A1 * | 10/2002 | Babcock ................ 331/158 |
| 2003/0122630 A1 * | 7/2003 | Fallisgaard et al. ....... 331/158 |
| 2003/0174538 A1 * | 9/2003 | Uribe et al. .......... 365/185.03 |

* cited by examiner

*Primary Examiner*—Joseph Chang
(74) *Attorney, Agent, or Firm*—Marger Johnson & McCollom P.C.

(57) ABSTRACT

According to embodiments of the invention, a nonvolatile memory such as a flash memory is used to configure a single die after packaging of the die has occurred. Thus, numerous applications may be supported by a single die or optimization within a given application may occur. According to embodiments of the invention, the nonvolatile memory may be accessed through a programming interface, and preferably, through a two-pin programming interface, to normalize parameters such as package parasitics, crystal variations, output dividers, output duty cycle, output edge rates, I/O configuration, and oscillator gain. According to an embodiment of the invention, an XO circuit configuration includes a nonvolatile memory and a stand-alone XO, where the XO circuit configuration does not require a PLL to synthesize a reference frequency produced by the XO.

22 Claims, 3 Drawing Sheets

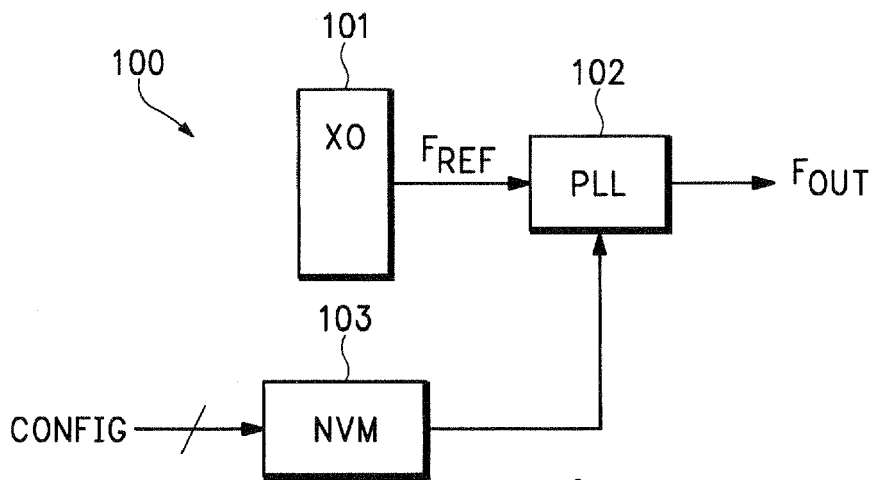
Fig.1
(CONVENTIONAL)

NONVOLATILE PROGRAMMABLE CRYSTAL OSCILLATOR CIRCUIT

BACKGROUND OF THE INVENTION

1. Technical Field of the Invention

This disclosure relates in general to oscillators, and more particularly, to a nonvolatile programmable crystal oscillator.

2. Description of the Related Art

A crystal oscillator, or XO, is an electronic device that uses the mechanical resonance of a physical crystal of piezoelectric material to create an electrical signal with a very precise frequency. The XO is an especially accurate form of an electronic oscillator, and it is the most common source of time and frequency signals. The piezoelectric crystal of an XO is typically composed of synthetic (man-made) quartz, but it may also be made of rubidium or ceramic. The output frequency of the XO may be used to, among other things, keep track of time (as in quartz wristwatches) or to stabilize frequencies for radio transmitters. Since the piezoelectric crystals may also be embedded in integrated circuits, the XOs are also frequently used to provide a stable clock for digital circuits.

The piezoelectric crystal in the XO may also be referred to as a "timing crystal," or "resonator." Because of the piezoelectric effect, the resonator strains (expands or contracts) when an electrical voltage is applied. When the applied voltage is reversed, the strain is reversed. The above application of voltages causes the resonator to oscillate.

Oscillation of the XO is sustained by taking a voltage signal from the resonator, amplifying it, and feeding it back to the resonator. The rate of expansion and contraction of the timing crystal is the resonance frequency, and it is a function of the cut and the size of the crystal. The output frequency of an XO is either the resonance frequency or a multiple of the resonance frequency, called an overtone frequency.

The XO is an important device because of its ability to have extremely narrow bandwidth with good filter shape factor (sharpness of passband/stopband characteristic). At their frequencies of operation, XOs can generate narrow bandwidths, unobtainable with lumped element inductors (Ls) and capacitors (Cs). The quality factor (Q) is the parameter that describes this performance. By definition, Q is the ratio of energy stored by oscillation cycle to energy lost per cycle. A typical Q for an XO such as a quartz oscillator ranges from $10^4$ to $10^6$. The maximum Q for a high stability quartz oscillator can be estimated as $Q=1.6\times10^7/f$, where f is the resonance frequency in MHz.

The short-term stability of the output of the XO is affected by environmental changes such as temperature, humidity, pressure, and vibration, all of which can change the resonance frequency of the timing crystal. The long-term stability of the XO is primarily affected by aging of the crystal itself.

Due to aging and environmental factors such as temperature and vibration, it is hard to keep even the best XOs within $10^{-10}$ of their nominal frequency without constant adjustment.

As is well-known in the art, XOs may be classified according to the methods by which their frequency outputs are controlled. For instance, XOs may be classified as voltage-controlled crystal oscillators (VCXOs), temperature-compensated crystal oscillators (TCXOs), oven-controlled crystal oscillators (OCXOs), temperature-compensated-voltage controlled crystal oscillators (TCVCXOs), oven-controlled voltage-controlled crystal oscillators (OCVCXOs), or microcomputer-compensated crystal oscillators (MCXOs). In U.S. Pat. No. 6,563,390, a digitally compensated Voltage-Controlled Oscillator (VCXO) is disclosed. The digitally compensated VCXO may be adjusted with a tuning circuit that includes a frequency tuning array that is implemented with a non-volatile memory.

FIG. 1 is a block diagram illustrating some components of a conventional crystal oscillator circuit. The oscillator circuit 100 includes an XO 101, a Phase-Locked Loop (PLL) 102, and a Non-Volatile Memory (NVM) 103. The possible internal arrangements of the oscillator 101, PLL 102, and NVM 103 are numerous and well-known to those of skill in the art.

In crystal oscillator circuit 100, the NVM 103 receives external configuration signals (CONFIG) as input. Based upon the configuration signals, the NVM 103 controls the XO 101 and the PLL 102. The XO 101 produces a reference frequency $F_{REF}$, which is input to the PLL 102. In a well-known process, the PLL 102 multiplies the reference frequency $F_{REF}$ by a ratio of integers to achieve the desired output frequency $F_{OUT}$. The ratio of integers may be greater than or less than 1.

When a conventional crystal oscillator circuit, such as circuit 100 as described above, is implemented in an integrated circuit, the divider registers of the PLL 102 must be programmed at metal mask. That is, existing Read-Only Memory (ROM) technologies such as trim, select-at-test, or metal mask options are performed to configure the PLL 102. Metal options increase the mask cost for the product, while trim technologies may only be applied once per die at wafer sort, rendering the dies suitable for only one particular application.

Embodiments of the invention improve upon these and other features of the above-described art.

BRIEF DESCRIPTION OF THE DRAWINGS

Some embodiments of the invention will be described with reference to the following drawings, in which like reference numbers refer to like elements.

FIG. 1 is a block diagram illustrating components of a conventional crystal oscillator circuit.

DETAILED DESCRIPTION OF THE INVENTION

According to some embodiments of the invention, nonvolatile memory such as flash memory is used to configure a single die after packaging of the die has occurred. Thus, numerous applications may be supported by a single die or optimization within a given application may occur. According to some embodiments of the invention, the nonvolatile memory may be accessed through a programming interface, and preferably, through a two-pin programming interface, to normalize parameters such as package parasitics, crystal variations, output dividers, output duty cycle, output edge rates, I/O configuration, and oscillator gain. According to an embodiment of the invention, an XO circuit configuration includes a nonvolatile memory and a stand-alone XO, where the XO circuit configuration does not require a PLL to synthesize a reference frequency produced by the XO.

Figure 2:
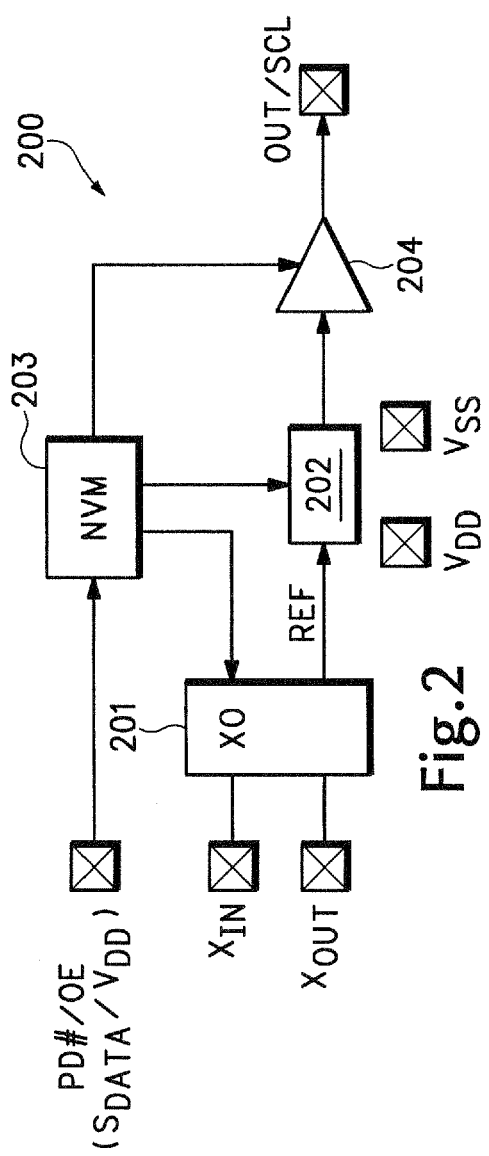
FIG. 2 is a block diagram illustrating components of a crystal oscillator circuit according to some embodiments of the invention.

FIG. 2 is a block diagram illustrating components of a crystal oscillator circuit according to some embodiments of the invention.

Referring to FIG. 2, an oscillator circuit 200 includes a crystal oscillator 201, a divider 202, non-volatile memory 203, and an output buffer 204. In some embodiments of the invention, the non-volatile memory 203 may be implemented as a flash memory. Alternatively, the non-volatile memory 203 may be implemented as an Electrically Eraseable Programmable Read Only Memory (EEPROM), a One-Time Programmable (OTP), a Ferroelectric Random Access Memory (FRAM), or an Ovonic Unified Memory (OUM).

The oscillator circuit 200 also includes a number of external circuit connections to one or more of the crystal oscillator 201, the divider 202, non-volatile memory 203, and output buffer 204. In some embodiments of the invention, these external circuit connections may be implemented as pins, such as pins in a wafer-type package. For convenience, these external circuit connections may also be referred to as pins throughout the remainder of this specification.

The VDD pin is one such external connection. The VDD pin is used to electrically couple a supply voltage VDD to components of the oscillator circuit 200. A typical supply voltage VDD for the oscillator circuit 200 may be, for example, 2.7 to 3.6 V. Although the individual internal connections of the supply voltage VDD to the component parts of the oscillator circuit 200 are not illustrated, it will be recognized that the supply voltage VDD may be internally supplied to one or more of the crystal oscillator 201, the divider 202, non-volatile memory 203, and output buffer 204 of the crystal oscillator circuit. Likewise, the VSS pin may be used to electrically couple a common, or ground, voltage VSS to one or more of the crystal oscillator 201, the divider 202, non-volatile memory 203, and output buffer 204.

The XIN and XOUT pins are electrically connected to an input node XIN, and an output node, respectively, of the crystal oscillator 201. As will be explained in greater detail below, the crystal included in the crystal oscillator 201 has a programmable load capacitance $C_L$, which may be implemented by an array of input tuning capacitors and output tuning capacitors. The input tuning capacitors may be commonly connected to the XIN pin, while the output tuning capacitors may be commonly connected to the XOUT pin.

The OUT/SCL pin is electrically connected to the output of output buffer 204. Depending on the mode of operation of the oscillator circuit 200, the oscillator circuit may provide to the OUT(SCL) pin a clock output derived from the reference frequency $F_{REF}$ of the crystal oscillator 201. Alternatively, the oscillator circuit 200 may provide to the OUT (SCL) pin a serial clock that can be used for programming the non-volatile memory 203 of the oscillator circuit 200 during a test mode. Because the OUT/SCL pin may be programmed to carry different outputs depending on the operation mode of the oscillator circuit 200, the OUT/SCL pin may be referred to as a programmable pin.

Finally, the PD#/OE pin is electrically connected to an input of the programmable non-volatile memory 203. Like the OUT/SCL pin, the PD#/OE pin may also programmed to have a different function depending on the operation mode of the oscillator circuit 200. Thus, the PD#/OE pin may also be referred to as a programmable pin. According to the embodiments illustrated in FIG. 2, the PD#/OE pin may be used either as a power-down pin or an output enable pin. In the power-down scenario, a signal applied to the PD#/OE pin may cause the crystal oscillator circuit 200 to operate at a lower power level than normal. In the output enable scenario, a signal applied to the PD#/OE pin may cause the oscillator circuit 200 to operate in a normal fashion.

Additionally, in some embodiments of the invention, a specialized waveform having a selected frequency and amplitude may be applied to one or more pins to initiate programming of the non-volatile memory 203. As explained above, the non-volatile memory 203 may be implemented with any type of non-volatile memory, such as flash memory.

In some embodiments of the invention, the PD#/OE pin may also be used for inputting serial data to the non-volatile memory 203 for programming while the oscillator circuit 200 is in a test mode of operation.

Thus, as explained above, embodiments of the invention provide flexibility in output configurations and testing. Furthermore, the outputs may be selectable to change instantaneously or synchronously with respect to other outputs.

As illustrated in FIG. 2, the crystal oscillator produces a signal REF responsive to the non-volatile memory 203. Various parameters of the reference signal REF may be controlled depending on the settings stored in the non-volatile memory 203. For example, as will be explained in further detail below, the frequency of the reference signal REF may be fine-tuned, or pulled, by adjusting the load capacitance $C_L$ of the crystal oscillator 201 using a capacitor tuning array. Other parameters that may be controlled by the non-volatile memory 203 includes the rise and fall times and output slew rate.

Because the non-volatile memory 203 may be implemented with any type of non-volatile memory, such as flash memory, embodiments of the invention are capable of programming the output frequency after packaging occurs. This is contrary to the conventional crystal oscillator circuits described above, where the oscillator circuit is configured at the metal mask stage, making it suitable for only one application.

Other embodiments may utilize pin programming of the oscillator where the state at a given number of input pins programs the part. Another alternative is to provide an interface to the part that allows the part to be configured after power is applied to the system. These solutions require additional pins or components to configure the part for a particular application.

Returning to FIG. 2, the input divider 202 receives the reference signal REF as input. The divider 202 may then generate an output signal having a frequency that is less than or equal to the frequency of the reference signal REF. In some embodiments of the invention, the divider 202 may provide up to five divisors, the particular divisor selected depending on the settings of the non-volatile memory 203, which may be implemented with any type of non-volatile memory, such as flash memory. For example, if the crystal oscillator 201 was configured to produce a signal REF having a frequency of 48 MHz, an example divider 202 may be flash-programmable to output a signal having a frequency of 48 MHz (divide by 1), 24 MHz (divide by 2), 12 MHz (divide by 4), 6 MHz (divide by 8), or 3 MHz (divide by 16).

As used in this example, dividing by powers of 2 is used purely for illustrative purposes, alternative embodiments may use a divider 202 having more or less divisors, or divisors having different relationships between them.

After the reference signal REF is modified by the divider 202, the output of the divider is buffered by the output buffer 204, and the output of buffer 204 is electrically connected to the OUT/SCL pin. Thus the OUT/SCL pin may, in some modes of operation, carry the clock frequency signal derived from the reference signal REF that was produced by the crystal oscillator circuit 201.

Figure 3:
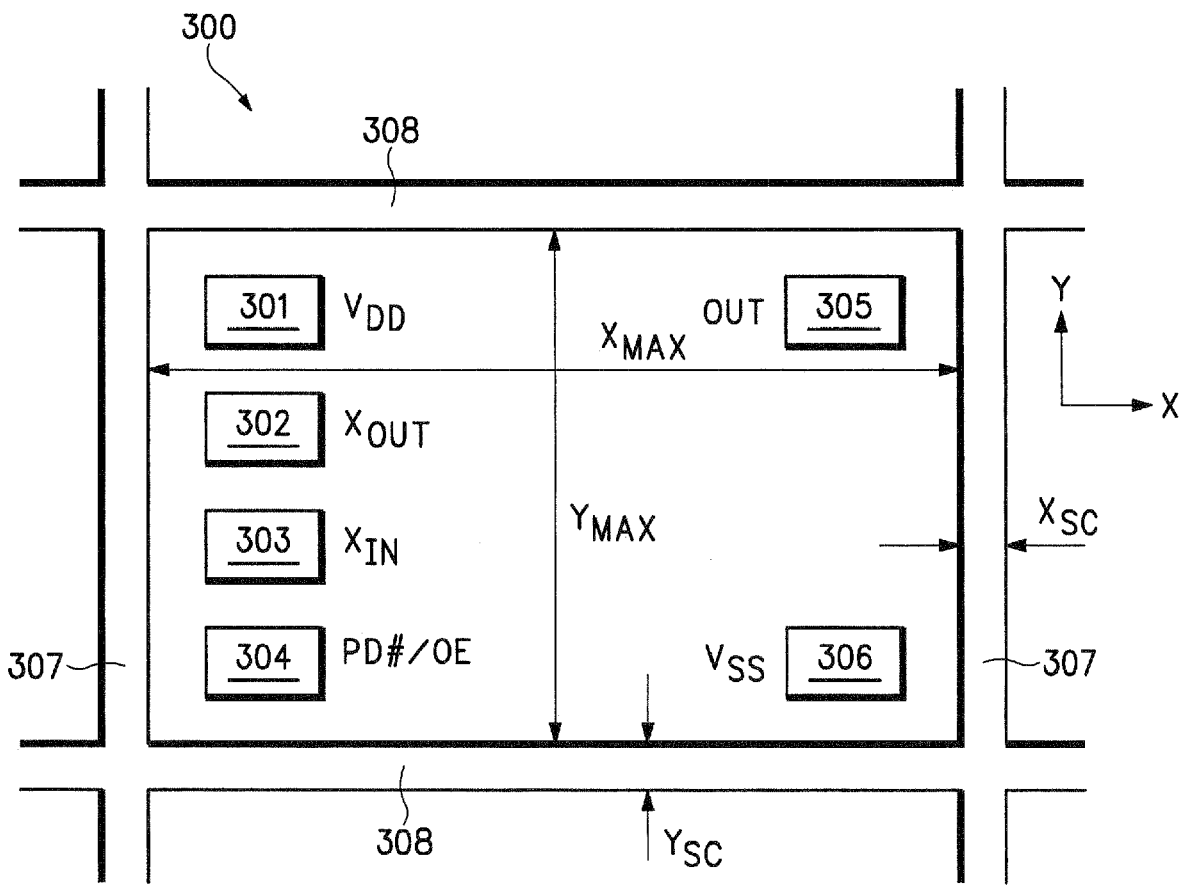
FIG. 3 is a die-pad diagram illustrating an exemplary wafer-type chip package in accordance with the embodiments illustrated in FIG. 2.

FIG. 3 is a die-pad diagram illustrating an exemplary wafer-type chip package in accordance with the embodiments illustrated in FIG. 2.

As illustrated in FIG. 3, a chip package 300 has six bond pads 301, 302, 303, 304, 305, and 306. Each of the six bond pads 301–306 corresponds to one of the six pins illustrated in FIG. 2. Thus, bond pad 301 corresponds to the VDD pin, bond pad 302 to the XOUT pin, bond pad 303 to the XIN pin, bond pad 304 to the PD#/OE pin, bond pad 305 to the OUT pin, and bond pad 306 to the VSS pin.

The chip package 300 is defined by the area between adjacent scribe lines 307 that are aligned in the Y direction and adjacent scribe lines 308 that are aligned in the X direction. In an exemplary embodiment, the maximum extent Xmax of the chip package 300 in the X direction may be 980 µm, while the maximum extent Ymax of the chip package 300 in the Y direction may be 988 µm. The width Xsc of the scribe lines 307 may be 70 µm, while the width Ycs of the scribe lines 308 may be 86 µm.

In an exemplary embodiment of the invention, the dimensions of the bond pads 301–306 are square. For instance, the bond pads 301–306 may be defined by an opening that is 85 µm×85 µm square, and having a minimum pad pitch of 175 µm between adjacent bond pads. Alternative embodiments of the invention may, of course, have chip packages with different physical dimensions then the ones described above. A typical thickness of the chip package 300 may be about 11 mm.

Furthermore, although the embodiments described above with respect to FIGS. 2 and 3 are illustrated as only having six pins/bond pads, it should be apparent that other embodiments of the invention may have more external circuit connections/pins than the ones described here.

Figure 4:
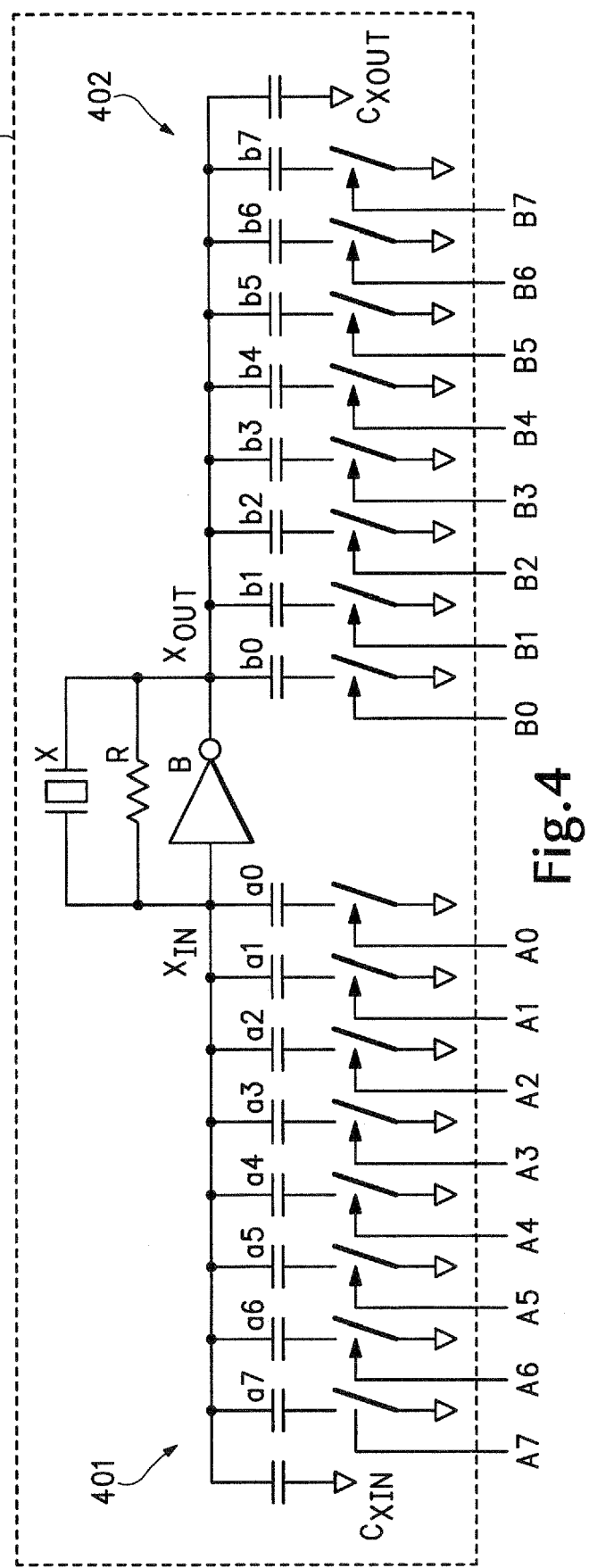
FIG. 4 is a circuit diagram illustrating an exemplary programmable load capacitance array in accordance with the embodiments illustrated in FIG. 2.

FIG. 4 is a circuit diagram illustrating some components of the crystal oscillator of FIG. 2, including a programmable load capacitance array. The programmable load capacitance array includes an input stage 401 and an output stage 402. Although the load capacitance array is illustrated as being part of the crystal oscillator 201, it should be apparent that, physically speaking, the circuit components illustrated in FIG. 4 may be located anywhere within a chip package, such as the chip package 300 of FIG. 3, subject to the design restraints that are imposed.

As illustrated in FIG. 4, the crystal oscillator 201 includes a crystal X, a resistor R, and a buffer B connected in parallel between an input node XIN and an output node XOUT of the crystal oscillator. The input stage 401 of the programmable load capacitance array includes a capacitor Cxin and a number of tuning capacitors a7, a6, a5, a4, a3, a2, a1, and a0. Similarly, the output stage 402 of the programmable load capacitance array includes a capacitor Cxout and a number of tuning capacitors b7, b6, . . . b1, b0. The tuning capacitors a7–a0 and the capacitor Cxin of the input stage 401 are commonly connected to the input node XIN. Similarly, the tuning capacitors b7–b0 and the capacitor Cxout of the output stage 402 are commonly connected to the output node XOUT. As was described above with reference to FIG. 2, the input node XIN and output node XOUT are electrically connected to the XIN pin and the XOUT pin, respectively, of the oscillator circuit 200.

As indicated by the switches between each of the tuning capacitors a7–a0, b7–b0 and a reference voltage, each tuning capacitor a7–a0 of the input stage 401 and each tuning capacitor b7–b0 of the output stage 402 is programmable to be either electrically connected or electrically disconnected to the reference voltage. The state of the switches is determined by the status of the bits A7–A0 and B7–B0 of non-volatile memory 203, which may be implemented by any type of nonvolatile memory, such as flash memory. That is, the switches for individual tuning capacitors a7–a0, b7–b0 may be opened or closed depending on the value of the corresponding bits A7–A0, B7–B0 in the non-volatile memory 203.

When the tuning capacitors a7–a0, b7–b0 are connected to the reference voltage through their corresponding switch, their individual capacitances contribute to the overall load capacitance $C_L$ of the crystal oscillator 201. Conversely, when the tuning capacitors a7–a0, b7–b0 are disconnected from the reference voltage by their corresponding switch, their individual capacitances do not contribute to the overall load capacitance $C_L$ of the crystal oscillator 201.

By programming the non-volatile memory 203, which may be implemented by any type of nonvolatile memory, such as flash memory, each of the tuning capacitors a7–a0, b7–b0 of the crystal oscillator may be selectively set to contribute to the load capacitance $C_L$. This allows the load capacitance $C_L$ of the crystal oscillator 201 to be adjusted as the need arises to compensate for drift of the nominal crystal frequency due to both short-term stability effects and long-term stability effects.

In the illustrated embodiment, the capacitor Cxin of the input stage 401 and the capacitor Cxout of the output stage 401 are not tunable. That is, they are preferably always connected to the reference voltage. A typical value for the capacitors Cxin and Cxout is 10 pf.

In the programmable load capacitance array of FIG. 4, it is preferred that the tuning capacitors a7–a0 of the input stage 401 be matched with the tuning capacitors b7–b0 of the output stage 402. That is, capacitor a7 of the input stage 401 preferably has the same value as capacitor b7 of the output stage 402, capacitor a6 of the input stage preferably has the same value as capacitor b6 of the output stage, etc.

However, in other embodiments of the invention it may be desirable to use tuning capacitors a7–a0 that are not matched with tuning capacitors b7–b0 to control the amplitude of oscillation at Xin or Xout and thus control the amplitude of oscillation.

Table 1 below lists an exemplary set of effective capacitances for the tuning capacitors a7–a0 of the input stage 401 and for the tuning capacitors b7–b0 of the output stage 402. Using the effective capacitance values listed in Table 1, the overall load capacitance $C_L$ of the crystal oscillator 201 may be adjusted between about 5 and 10 pF. The number of tuning capacitors in the input stage 401 and the output stage 402 and the values of each tuning capacitor may be larger or smaller depending on the desired performance of the crystal oscillator circuit 200.

TABLE 1

| Capacitor | Effective Capacitance (pF) |
| --- | --- |
| a7, b7 | 5.000 |
| a6, b6 | 2.500 |
| a5, b5 | 1.250 |
| a4, b4 | 0.625 |
| a3, b3 | 0.313 |
| a2, b2 | 0.156 |
| a1, b1 | 0.078 |
| a0, b0 | 0.039 |

Referring to FIGS. 2 and 4, the crystal X in the crystal oscillator circuit 201 may be composed of any conventionally known substance, for example, synthetic or natural quartz, rubidium, or ceramics. In one particular embodiment, a crystal may be used that has a nominal frequency (in the fundamental mode) that is tunable between 10 and 48 MHz. The equivalent series resistance (ESR) of this crystal may be about 40 Ω, and the crystal shunt capacitance $C_0$ and crystal motional capacitance $C_1$ may be about 5 pF and 2 fF (femto-Farads), respectively. Other crystals with different parameters may be used, of course, depending on the desired performance of the crystal oscillator circuit 200.

Returning to FIG. 2, as was explained above, the PD#/OE pin and the OUT/SCL pin of the oscillator circuit 200 are programmable. Thus, the PD#/OE pin and the OUT/SCL pin together form a two-pin programming interface. By implementing such a two-pin programming interface with an oscillator circuit 200 that includes a non-volatile memory 203, such as flash memory, and a stand-alone crystal oscillator 201, the oscillator circuit 200 may be configured for different application after packaging of the die has occurred. Thus, numerous applications may be supported by a single die or optimization within a given application may occur. As used above, a "stand-alone crystal oscillator" refers to the capability of embodiments of the invention to synthesize a reference frequency produced by the crystal oscillator 201 without requiring a PLL.

According to some embodiments of the invention, the two-pin programming interface accesses the non-volatile memory and resets bits stored within the non-volatile memory, in order to normalize parameters of the oscillator circuit 200 such as package parasitics, crystal variations, output dividers, output duty cycle, output edge rates, I/O configuration, and oscillator gain.

Figure 5:
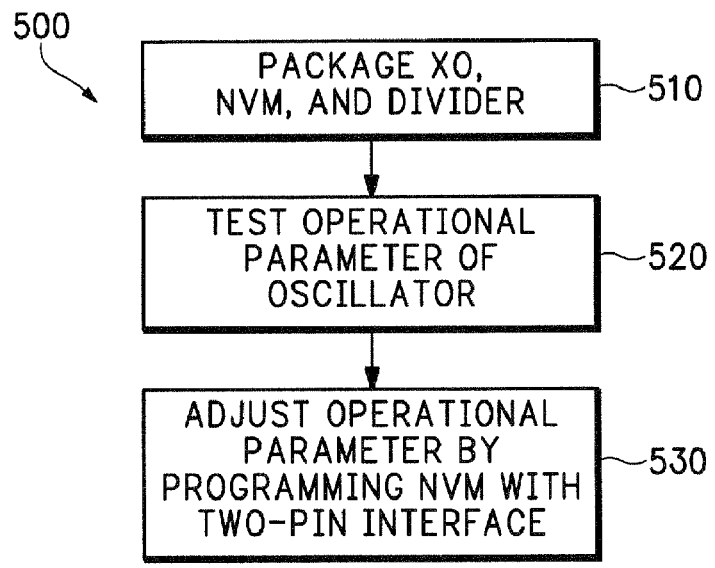
FIG. 5 is a flow diagram illustrating a method of manufacturing a crystal oscillator circuit in accordance with some embodiments of the invention.

FIG. 5 is a flow diagram illustrating a method 500 of manufacturing a crystal oscillator circuit in accordance with some embodiments of the invention.

In process 510, a crystal oscillator (XO), a non-volatile memory (NVM), and a divider are packaged in a die. The XO, NVM, and divider form part of an oscillator circuit, which preferably does not include a PLL. The die is preferably a small-size, surface-mount package.

In process 520, an operational parameter of the oscillator circuit is tested. An operational parameter may include a frequency of the output signal of the oscillator circuit, a rise time of the output signal, a fall time of the output signal, or a slew rate of the output signal.

In process 530, the operational parameter of the oscillator circuit is adjusted by programming the non-volatile memory using a two-pin interface. Depending on the bits stored in the non-volatile memory, the internal electrical connections of the oscillator circuit may be arranged to adjust the desired operational parameter. For example, by opening and/or closing switches based upon bits stored in the non-volatile memory, the tuning capacitors of a programmable load capacitance array in the XO may be reconfigured to change the overall load capacitance $C_L$ of the resonator within the XO. As is well known, this alteration of the load capacitance $C_L$ pulls the frequency of the reference signal produced by the XO.

As another example, the divisor that is used to divide the frequency of the reference signal to produce the output signal may be selected based upon the state of other bits stored in the non-volatile memory. Similarly, the other operational parameters may be adjusted using the same techniques.

Figure 6:
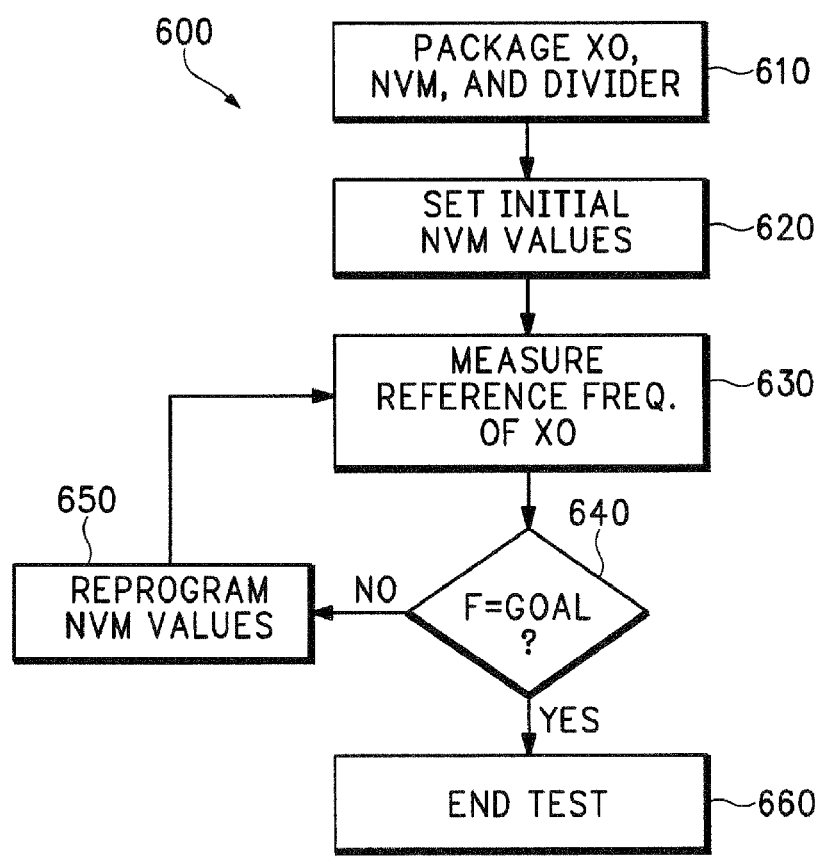
FIG. 6 is a flow diagram illustrating in further detail a method of manufacturing a crystal oscillator circuit in accordance with the embodiments of FIG. 5.

FIG. 6 is a flow diagram illustrating in further detail a method 600 of manufacturing a crystal oscillator circuit that is in accordance with the embodiments illustrated in FIG. 5.

Similar to method 500 of FIG. 5, method 600 of FIG. 6 begins with the process 610 of packaging a crystal oscillator (XO), a non-volatile memory (NVM), and a divider in a die package. The XO, NVM, and divider form part of an oscillator circuit, which preferably does not include a PLL. The die is preferably a small-size, surface-mount package.

Next, in process 620, initial values of the non-volatile memory may be programmed. Preferably, the initial values of the non-volatile memory are programmed using the two-pin programming interface described above.

According to some embodiments of the invention, the initial values may include, for example, the values of bits a7–a0 and b7–b0 that determine whether tuning capacitors A7–A0 and B7–B0 are activated, as explained above with reference to FIG. 4. Initial values for bits A7–A0 and B7–B0 may be 10000000, which using Table 1 above indicates that both the input stage 401 and the output stage 402 of the programmable load capacitance array are set to 5 pF. The initial values may also include the values of bits that determine which value is used by the divider 202 to divide the reference frequency produced by the XO.

For a particular application, it may be desired that the oscillator circuit produce a specific frequency at a specific temperature. After the initial values of the NVM have been set in process 620, the die including the oscillator circuit may be placed in an environmental chamber that is adjustable to the desired specific temperature.

Next, in process 630, the frequency of the output signal produced by the XO at the specific temperature may be measured. Due to crystal variations, the frequency may be slightly higher or lower than the desired specific frequency. In process 640, a comparison is made to determine if the XO output frequency is sufficiently close to the desired specific frequency. If it is, then the method ends at process 660.

However, if the XO output frequency is determined to be too far from the desired specific frequency, the initial values stored in the NVM may be reprogrammed to have different values in process 650. Preferably, the initial values of the non-volatile memory are reprogrammed using the two-pin programming interface described above.

For example, the initial values of bits A7–A0 and B7–B0 may be reprogrammed to 10000001. This reprogramming causes the switch corresponding to capacitors a0 and b0 to close, adding an additional contribution of 0.039 pF to both the input stage 401 and the output stage 402. This, in turn, causes the overall load capacitance of the XO to change and the frequency output of the XO is pulled either up or down to more closely match the specific frequency that is desired. Processes 630, 640, and 650 may be iteratively repeated many times until the frequency of the reference signal produced by the XO is satisfactorily close to the desired specific frequency.

One of ordinary skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. For instance, although a two-pin programming interface was used as an example in the method described above, it will be appreciated that more pins may be used yet still without departing from the inventive concepts presented.

Furthermore, functionality shown embodied in a single integrated circuit or functional block may be implemented using multiple cooperating circuits or blocks, or vice versa. Such minor modifications are encompassed within the embodiments of the invention, and are intended to fall within the scope of the claims.

As indicated above, the invention may be practiced in many ways. What follows are exemplary, non-limiting descriptions of some embodiments of the invention.

According to some embodiments of the invention, an oscillator circuit includes a crystal oscillator configured to generate a reference signal having a reference frequency, a frequency divider configured to divide the reference signal to produce a clock output, and a non-volatile memory configured to adjust a parameter of the crystal oscillator and the frequency divider.

According to some embodiments of the invention, the frequency divider may not constitute a part of a phase-locked loop.

According to some embodiments of the invention, the oscillator circuit may additionally include a buffer connected to the clock output.

According to some embodiments of the invention, the non-volatile memory may be programmable through an external interface.

According to some embodiments of the invention, the external interface includes a two-wire interface.

According to some embodiments of the invention, the crystal oscillator includes a crystal composed of one selected from the group consisting of quartz, rubidium, and ceramic.

According to some embodiments of the invention, the crystal oscillator also includes a programmable load capacitance tuning array.

According to some other embodiments of the invention, a device includes a crystal oscillator circuit configured to generate a reference signal, a frequency divider circuit configured to generate an output signal by dividing the reference signal by a selected denominator; and a control circuit configured to modify the output signal by controlling at least one of the crystal oscillator circuit and the frequency divider circuit.

According to some embodiments of the invention, the frequency divider circuit does not form part of a phase-locked loop.

According to some embodiments of the invention, the control circuit includes a non-volatile memory device.

According to some embodiments of the invention, the non-volatile memory device is capable of being programmed to set an operational parameter of the crystal oscillator circuit.

According to some embodiments of the invention, the non-volatile memory device includes one selected from the group consisting of a flash memory device, an Electrically Eraseable Programmable Read Only Memory (EEPROM), a One-Time Programmable (OTP), a Ferroelectric Random Access Memory (FRAM), and an Ovonic Unified Memory (OUM).

According to some embodiments of the invention, the crystal oscillator circuit includes a programmable load capacitance tuning array.

According to some embodiments of the invention, the crystal oscillator circuit, the control circuit, and the divider circuit are packaged in a wafer-type die package.

According to some embodiments of the invention, the crystal oscillator circuit includes a crystal composed of quartz, rubidium, or ceramic.

According to still other embodiments of the invention, a method includes packaging a crystal oscillator, a non-volatile memory, and a frequency divider in a die to form an oscillator circuit, testing an operational parameter of the oscillator circuit, and adjusting the operational parameter of the oscillator circuit by programming the non-volatile memory through an external interface.

According to some embodiments of the invention, adjusting the operational parameter includes programming the non-volatile memory through an external two-wire interface.

According to some embodiments of the invention, programming the non-volatile memory includes pulling a frequency of a reference signal from the crystal oscillator by setting bits in the non-volatile memory to select a load capacitance value for the crystal oscillator.

According to some embodiments of the invention, programming the non-volatile memory includes setting bits in the non-volatile memory to select a denominator used by the frequency divider to divide a reference signal from the crystal oscillator.

According to some embodiments of the invention, programming the non-volatile memory includes setting bits in the non-volatile memory to control at least one selected from the group consisting of an amplifier gain, a duty cycle, and a slew rate.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

It will be appreciated by those skilled in the art that changes in these described embodiments of the invention may be made without departing from the principles and spirit of the invention itself, the scope of which is defined by the appended claims.

We claim:

1. An oscillator circuit having an output, the oscillator circuit comprising:
   a crystal oscillator configured to generate a reference signal having a reference frequency;
   a frequency divider configured to divide the reference signal to produce a clock output, the oscillator circuit structured such that the clock output of the frequency divider is not provided as input to a phase-locked loop; and
   a non-volatile memory configured to adjust a parameter of the crystal oscillator and the frequency divider.

2. The oscillator circuit of claim 1, further comprising a buffer, the buffer configured to accept the clock output of the frequency divider as input, the buffer further configured to generate the output of the oscillator circuit in response to the clock output of the frequency divider.

3. The oscillator circuit of claim 2, the buffer directly connected to to clock output.

4. The oscillator circuit of claim 1, wherein the non-volatile memory is programmable through an external interface electrically coupled to the non-volatile memory.

5. The oscillator circuit of claim 4, wherein the external interface comprises a two-wire interface.

6. The crystal oscillator circuit of claim 1, where to non-volatile memory is configured responsive to the reference frequency.

7. The oscillator circuit of claim 1, wherein the crystal oscillator further comprises a programmable load capacitance tuning array.

8. A chip package having an oscillator circuit and external connections that define inputs and outputs of the oscillator circuit, the oscillator circuit not comprising a phase-locked loop but instead comprising:
 a stand-alone crystal oscillator configured to generate a reference signal;
 a frequency divider that receives the reference signal as an input, the frequency divider configured to generate an output signal having an output frequency that is less than or equal to a reference frequency of the reference signal, the oscillator circuit configured to provide the output signal to one of the external connections; and
 a controller configured to supply a first signal to the stand-alone crystal oscillator and a second signal to the frequency divider, the controller configured to change the output signal from the frequency divider by altering at least one of the first signal and the second signal.

9. The chip package of claim 8, wherein the oscillator circuit is configured to provide a buffered version of the output signal to the one of the external connections.

10. The chip package of claim 8, the controller comprising a non-volatile memory device.

11. The chip package of claim 10, the non-volatile memory device capable of being programmed to set an operational parameter of the stand-alone crystal oscillator.

12. The chip package of claim 10, the non-volatile memory device comprising one selected from the group consisting of a flash memory device, an EEPROM, an OTP, a FRAM, and an OUM.

13. The chip package of claim 8, wherein the stand-alone crystal oscillator comprises a programmable load capacitance tuning array.

14. The chip package of claim 8, wherein the stand-alone crystal oscillator, the controller, and the frequency divider circuit are packaged in a wafer-type die package.

15. The chip package of claim 8, where to controller may be configured responsive to the reference signal.

16. A method comprising:
 packaging a crystal oscillator, a non-volatile memory, and a frequency divider in a die to form an oscillator circuit that is capable of producing an output at an external connection of the die, the oscillator circuit capable of producing the output without synthesizing a reference frequency using a phase-locked loop, the reference frequency generated by the crystal oscillator;
 testing an operational parameter of the oscillator circuit; and
 adjusting the operational parameter of the oscillator circuit by programming the non-volatile memory through an external interface responsive to the testing.

17. The method of claim 16, wherein adjusting the operational parameter comprises programming the non-volatile memory through an external two-wire interface.

18. The method of claim 17, wherein programming the non-volatile memory comprises pulling a frequency of a reference signal from the crystal oscillator by setting bits in the non-volatile memory to select a load capacitance value for the crystal oscillator.

19. The method of claim 17, wherein programming the non-volatile memory comprises setting bits in the non-volatile memory to select a denominator used by the frequency divider to divide a reference signal from the crystal oscillator.

20. The method of claim 17, wherein programming the non-volatile memory comprises setting bits in the non-volatile memory to control at least one selected from the group consisting of an amplifier gain, a duty cycle, and a slew rate.

21. The method of claim 16, wherein packaging the crystal oscillator, the non-volatile memory, and to frequency divider in the die does not include packaging a phase-locked loop circuit in the die.

22. The method of claim 16, further comprising providing an output of the oscillator circuit at an external interface of to die, to output of the oscillator circuit consisting of a quotient of a reference signal provided by the crystal oscillator and a denominator provided by the non-volatile memory.

* * * * *